(12) United States Patent
Suzuki et al.

(10) Patent No.: US 7,656,179 B2
(45) Date of Patent: Feb. 2, 2010

(54) RELAY CONNECTOR HAVING A PIN BLOCK AND A FLOATING GUIDE WITH GUIDE HOLE

(75) Inventors: Hisashi Suzuki, Tokyo (JP); Ryoichi Hirako, Tokyo (JP)

(73) Assignee: Yokowo Co., Ltd., Tokyo (JP)

( * ) Notice: Subject to any disclaimer, the term of this patent is extended or adjusted under 35 U.S.C. 154(b) by 85 days.

(21) Appl. No.: 11/979,851

(22) Filed: Nov. 8, 2007

(65) Prior Publication Data
US 2008/0129321 A1   Jun. 5, 2008

(30) Foreign Application Priority Data
Nov. 10, 2006  (JP)  ............... 2006-305363
Oct. 11, 2007  (JP)  ............... 2007-265372

(51) Int. Cl.
  *G01R 31/02*  (2006.01)
(52) U.S. Cl. .................... 324/755; 324/538
(58) Field of Classification Search ............... None
  See application file for complete search history.

(56) References Cited

U.S. PATENT DOCUMENTS

| | | | |
|---|---|---|---|
| 3,787,768 A | 1/1974 | Kubota et al. | |
| 4,225,819 A | 9/1980 | Grau et al. | 324/415 |
| 5,572,144 A | 11/1996 | Davidson et al. | |
| 5,788,526 A * | 8/1998 | Twigg et al. | 439/331 |
| 5,807,104 A * | 9/1998 | Ikeya et al. | 439/73 |
| 6,046,597 A * | 4/2000 | Barabi | 324/755 |
| 6,734,690 B1 | 5/2004 | Ashby | |
| 6,752,645 B2 * | 6/2004 | Nakamura et al. | 439/330 |
| 6,844,749 B2 * | 1/2005 | Sinclair | 324/761 |
| 2004/0189332 A1 | 9/2004 | Liang et al. | |
| 2004/0239351 A1 | 12/2004 | Sawada et al. | 324/754 |
| 2006/0084290 A1 | 4/2006 | Nagashima | 439/71 |
| 2007/0259543 A1 * | 11/2007 | Hsieh | 439/73 |
| 2008/0139021 A1 * | 6/2008 | Suzuki et al. | 439/92 |

FOREIGN PATENT DOCUMENTS

| | | |
|---|---|---|
| GB | 2 276 281 A | 9/1994 |
| JP | 11-183521 | 9/1999 |
| JP | 2004-273192 | 9/2004 |
| JP | 2007-294146 | 8/2007 |

* cited by examiner

*Primary Examiner*—Paresh Patel
(74) *Attorney, Agent, or Firm*—Morgan, Lewis & Bockius LLP

(57) ABSTRACT

A relay connector connects a terminal of a connector to be inspected provided on a board for inspection to a measuring instrument. The relay connector includes: a pin block; a floating guide, arranged so as to approach and separate with respect to the pin block and resiliently urged in a separating direction, the floating guide formed with a guide hole; a plurality of probes, each of which is provided in the pin block so as to be opposed to the terminal of the connector to be inspected having been inserted into the guide hole; and a pressure operating member, adapted to be operated between an open state in which the connector to be inspected is allowed to be inserted into the guide hole in the floating guide, and a pressed state in which the connector to be inspected having been inserted into the floating guide is pressed toward the pin block.

19 Claims, 15 Drawing Sheets

RELAY CONNECTOR HAVING A PIN BLOCK AND A FLOATING GUIDE WITH GUIDE HOLE

BACKGROUND OF THE INVENTION

The present invention relates to a relay connector to be used for electrically connecting a connector to be inspected which is arranged on an inspection board for an electronic component or the like, to a measuring instrument.

In some of compact electronic devices such as a mobile phone and a digital camera, a plurality of boards are superposed on one another for the purpose of mounting many electronic circuits in a small space, and these boards are electrically connected by way of connectors which are respectively provided thereon. In order to inspect the boards and the connectors provided thereon, it has been conducted to electrically connect a measuring instrument or the like to the connectors by appropriate means. In order to inspect a whole unit of the board to be inspected and the connector to be inspected, it is desirable that the connector to be inspected is engaged with a jig-side connector to be mated, and then, they are electrically connected to the measuring instrument. However, in both of the connector to be inspected and the jig-side connector, the number of durable times for engagements and extractions is relatively small, that is, about 50 times. Therefore, the jig-side connector must be exchanged, every time when the number of time of inspections has reached the certain durable number. Provided that the jig-side connector is fixed to a jig-side board by soldering, and a number of wiring cables connected to the measuring instrument are soldered to the jig-side board, it is difficult to exchange only the jig-side connector. Therefore, the whole unit of the jig-side connector, the jig-side board, and the wiring cables must be exchanged inevitably. Consequently, there occurs such inconvenience that cost for measuring and inspection is increased.

In view of the above, the applicant of the invention has already proposed an art as disclosed in JP-A-2004-273192, and reduced the cost for the measuring and inspection, by decreasing parts to be exchanged. In this art which has been already proposed, the jig-side connector to be mated with the connector to be inspected is provided on an insulating relay board, and this insulating relay board is detachably mounted on a probe unit formed of insulating material. Probes are provided in this probe unit. Terminals of the jig-side connector are electrically connected to terminals provided on the insulating relay board, and the probes in the probe unit are brought into contact with the terminals on the insulating relay board for electrical connection. Other ends of the probes provided in the probe unit are electrically connected to a number of wiring cables to be connected to the measuring instrument by appropriate means. As the results, the connector to be inspected is electrically connected to the measuring instrument, by way of the jig-side connector, the insulating relay board, the probes, and the wiring cables. Accordingly, when the number of time of inspections has reached the certain durable number, only the jig-side connector and the insulating relay board may be exchanged, and the cost for the inspection can be reduced in proportion to decrease of the parts to be exchanged.

In the art proposed in the above described JP-A-2004-273192, it would be sufficient that only the jig-side connector and the insulating relay board are exchanged, and the cost for the inspection can be reduced, as compared with the above mentioned related art. However, this is not absolutely satisfactory. Under the circumstances, the inventors considered that the cost for the measuring and inspection can be reduced more with a structure in which the probes are directly brought into contact with the terminals of the connector to be inspected. In this structure, the jig-side connector and the insulating relay board need not be exchanged, and when the probe to be contacted is broken, only the relevant probe may be exchanged.

SUMMARY

It is therefore an object of the invention to provide a relay connector for bringing the probes into contact with the connector to be inspected.

In order to achieve the object, according to the invention, there is provided a relay connector, adapted to electrically connect a terminal of a connector to be inspected provided on a board for inspection to a measuring instrument, the relay connector comprising:

a pin block, comprised of insulating material;

a floating guide, comprised of insulating material, the floating guide arranged so as to approach and separate with respect to the pin block and resiliently urged in a separating direction, the floating guide formed with a guide hole in which the connector to be inspected is inserted so as to position the connector to be inspected toward the pin block;

a plurality of probes, each of which is provided in the pin block so as to be opposed to the terminal of the connector to be inspected having been inserted into the guide hole, an axial direction of each of which is parallel to an approaching and separating direction of the floating guide; and a pressure operating member, adapted to be operated between an open state in which the connector to be inspected is allowed to be inserted into the guide hole in the floating guide, and a pressed state in which the connector to be inspected having been inserted into the floating guide is pressed toward the pin block.

The pressure operating member may be provided with an engaging projection, the floating guide may be provided with an engage receiving part, and the engaging projection may be engaged with the engage receiving part in the open state of the pressure operating member so as to restrain the floating guide from moving toward the pin block.

The pressure operating member may be arranged so as to swing between the open state and the pressed state by means of a first swing shaft provided on a plane parallel to a face of the connector to be inspected having been inserted into the guide hole opposed to the pin block, and a pressure block may be arranged at a distal end side of the pressure operating member for pressing the connector to be inspected so as to swing by means of a second swing shaft parallel to the first swing shaft.

A floating pin including swelled parts at both ends thereof may be passed through the floating guide and the pin block in the approaching and separating direction of the floating guide, a distance of the floating guide moving from the pin block in the separating direction may be restricted by the swelled parts, and a float spring may be idly fitted to the floating pin in a contracted state between the floating guide and the pin block.

An adjusting screw may be screwed on one end of the floating pin so that the distance in the separating direction can be adjusted, and the pressure operating member may be formed with an adjusting hole so as to be opposed to the adjusting screw, whereby the adjusting screw can be adjusted from the exterior.

The floating guide may include a board mounting face by which the connector to be inspected is inserted into the guide hole toward the pin block, the board mounting face may include a flat face which is larger than the board for inspection, and no positional restriction may be applied to the board for inspection in a state where the connector to be inspected is inserted into the guide hole.

A restraining part for restraining the pressure operating member from swinging into the open state may be provided, and the engaging projection may be adapted to be engaged with the engage receiving part in a state where the pressure operating member is restrained by the restraining part.

In order to achieve the object, according to the invention, there is also provided a relay connector, adapted to electrically connect a terminal of a connector to be inspected provided on a board for inspection to a measuring instrument, the relay connector comprising:

a base member, comprised of insulating material;

a floating guide, comprised of insulating material, the floating guide arranged so as to approach and separate with respect to the base member, the floating guide formed with a guide hole in which the connector to be inspected is inserted so as to position the connector to be inspected in a state where the board for inspection is inserted between the base member and the floating guide;

a pressure operating member, adapted to sandwich the floating guide between the pressure operating member and the base member, and adapted to approach and separate with respect to the base member;

a pin block, comprised of insulating material, and provided with the pressure operating member so as to be opposed to the floating guide; and a plurality of probes, each of which is provided on the pin block so as to come into contact with the terminal of the connector to be inspected having been inserted into the guide hole in a state where the pin block is in contact with the floating guide, wherein the floating guide is adapted to separate from the base member in association with operation of the pressure operating member in a direction of separating the pin block from the floating guide, whereby the pressure operating member is operated between an open state where the connector to be inspected is allowed to be inserted between the base member and the floating guide, and a pressed state where the pin block is pressed toward the connector to be inspected having been inserted into the guide hole in the floating guide.

The base member may include a board mounting face opposed to the guide hole of the floating guide, a board positioning recess having a shape corresponding to a distal end portion of the board for inspection at an inserting side may be formed on the board mounting face from an edge part, and an insertion length and sideward displacement of the board for inspection may be restricted by the board positioning recess so as to position the board for inspection.

The floating guide may be guided by a linear guide provided on the base member, and the floating guide may be adapted to be contacted with and separated from the board mounting face of the base member in a vertical direction.

The pressure operating member may be arranged so as to swing in such a manner that a face of the pressure operating member opposed to the floating guide approaches and separates with respect to the base member, and a compression spring may be provided in a contracted state between the pressure operating member and the base member so as to resiliently urge the pressure operating member in a direction in which the face of the pressure operating member opposed to the floating guide approaches the base member.

The pressure operating member may be arranged so as to swing in such a manner that a face of the pressure operating member opposed to the floating guide approaches and separates with respect to the base member, a lever member may be arranged so as to swing by means of a swing shaft which is parallel to a swing shaft of the pressure operating member, one end of the lever member may be engaged with the floating guide, and the other end of the lever member may be pressed by operation of the pressure operating member, and the floating guide may swing in a direction of separating from the base member into the open state, in association with a swing motion of the face of the pressure operating member opposed to the floating guide in the direction of separating from the base member.

A depth of the guide hole formed in the floating guide may be set to be equal to a height of the connector to be inspected.

The floating guide may be provided with a concave part on a face opposed to the pin block, the pin block may be provided with a convex part to be engaged with the concave part, on a face opposed to the floating guide, and the floating guide and the pin block may be relatively positionedby engagement between the concave part and the convex part.

An outside part of the pressure operating member at a distal end opposed to the floating guide may be chamfered to form a slant face.

BRIEF DESCRIPTION OF THE DRAWINGS

FIGS. 13A and 13B show a structure for pressing the wiring board to the base member by means of ribs provided on the hinge member, in which FIG. 13A is a side view partly cut away, and FIG. 13B is a back view.

DETAIL DESCRIPTION OF PREFERRED EMBODIMENTS

Figure 1:
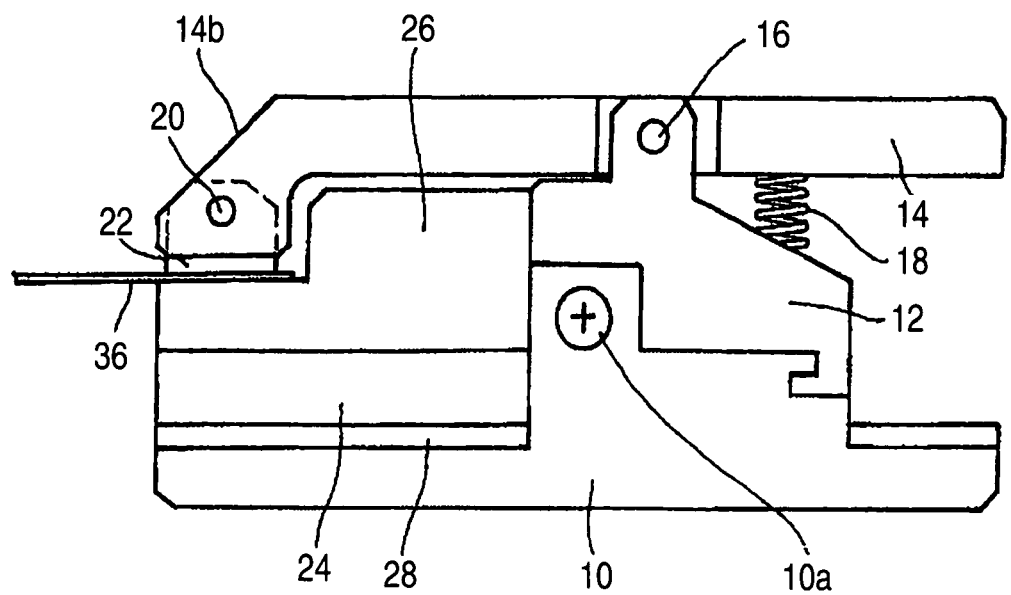
FIG. 1 is a side view of a relay connector in a pressed state in a first embodiment according to the invention.
Figure 2:
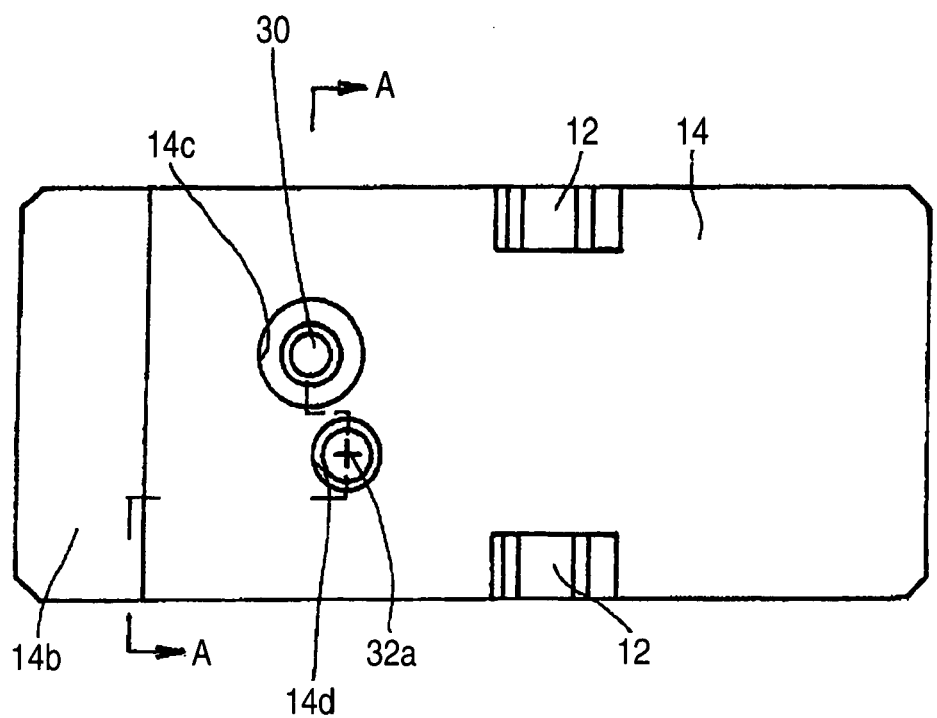
FIG. 2 is a plan view of FIG. 1.

Now, a first embodiment of the invention will be described referring to FIGS. 1 to 14.

In FIGS. 1 to 14, a relay connector in the first embodiment of the invention is constructed in the following manner. As a first step, a hinge member 12 is fixed to a base member 10 with a screw 10a. A pressure operating member 14 is provided on this hinge member 12 so as to swing by means of a swing shaft 16 which is passed through the pressure operating member 14. A compression spring 18 is provided in a contracted state between a rear part of the pressure operating member 14 and the hinge member 12. Moreover, a pressure block 22 is provided at a distal end side of the pressure operating member 14 so as to swing by means of a second swing shaft 20 which is passed through the operating member 14 in parallel with the swing shaft 16. In addition, a floating guide 26 formed of insulating material is arranged on a pin block 24 formed of insulating material so as to approach and separate with respect to each other linearly substantially in a swinging direction of the pressure operating member 14 at its distal end side, while a distance in a separating direction is restricted. Further, a wiring board 28 is fixed to the pin block 24 with a screw 28a at an opposite side to the floating guide 26. The pin block 24 and the wiring board 28 are fixed to the base member 10 with a screw 24a, setting the wiring board 28 at a side of the base member 10. An engage receiving part 26f is projected from the floating guide 26, and an engaging projection 14a is projected from the pressure operating member 14 so that the engage receiving part 26f may be engaged with the engaging projection 14a in an open state of the pressure operating member 14. Consequently, in the open state of the pressure operating member 14, the floating guide 26 is separated from the pin block 24, and the movement of the floating guide 26 toward the pin block 24 is restricted. Moreover, a backward end of the pressure operating member 14 is butted against the hinge member 12 in its open state thereby to restrain the swing motion, and the butted part of the hinge member 12 functions as a restraining part.

Figure 3:
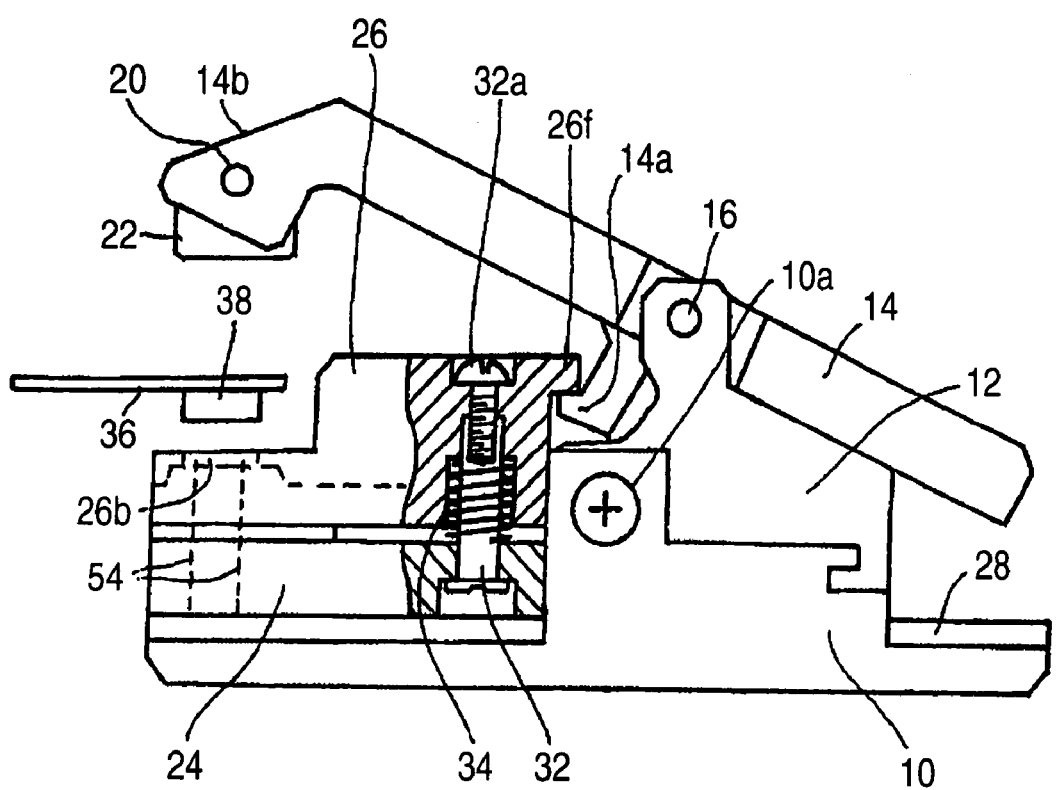
FIG. 3 is a side view of FIG. 1 in an open state.
Figure 4:
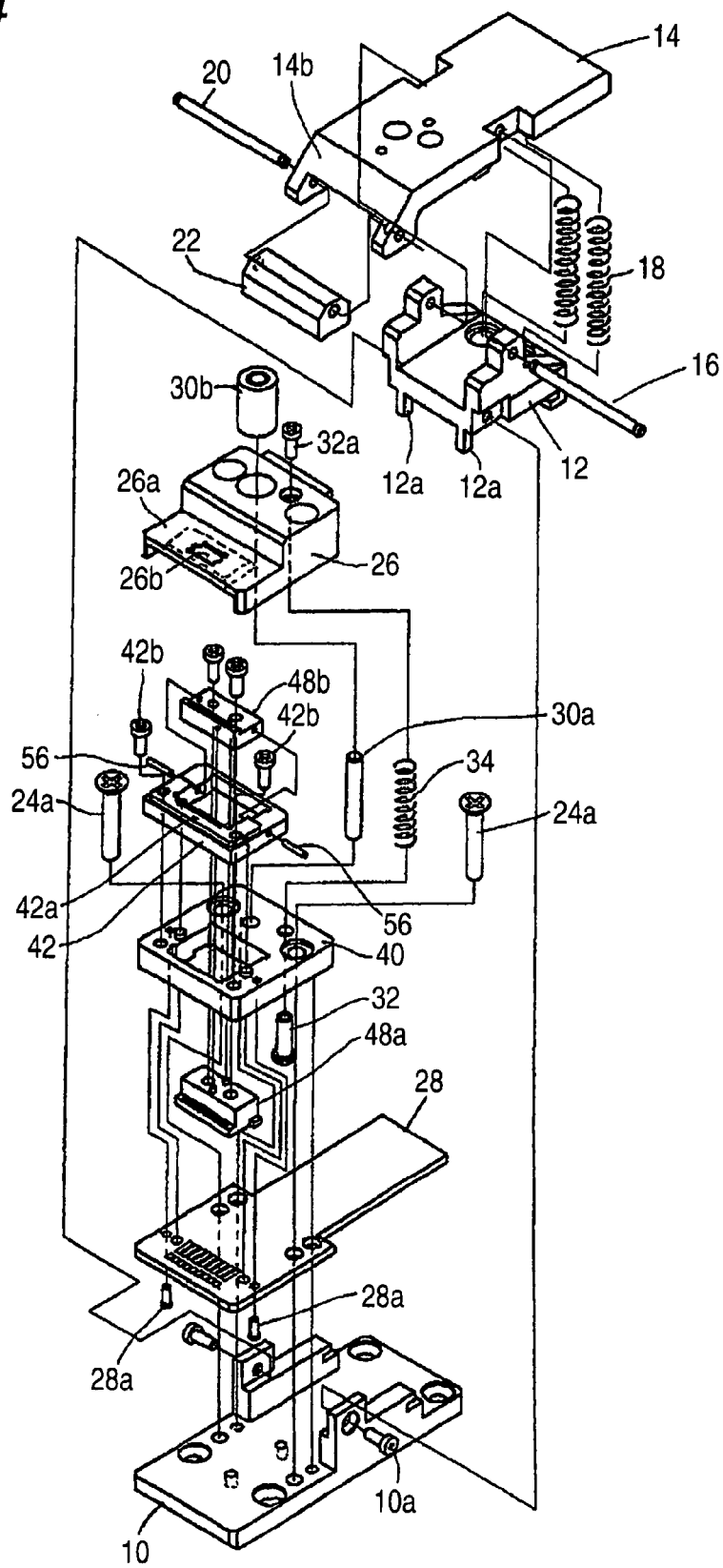
FIG. 4 is an exploded perspective view of FIG. 1.
Figure 5:
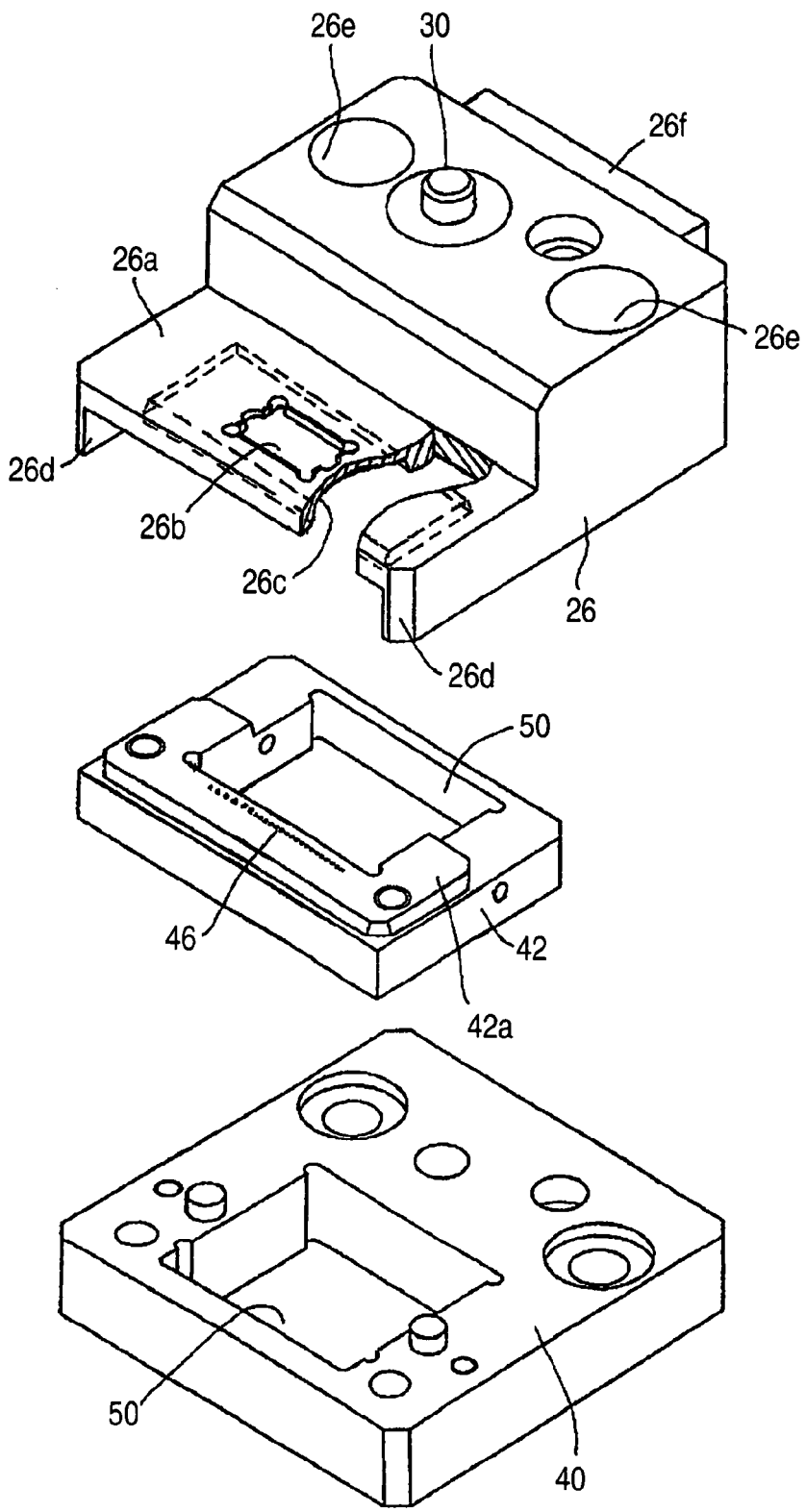
FIG. 5 is an exploded perspective view of upper and lower pin blocks and a floating guide.
Figure 6:
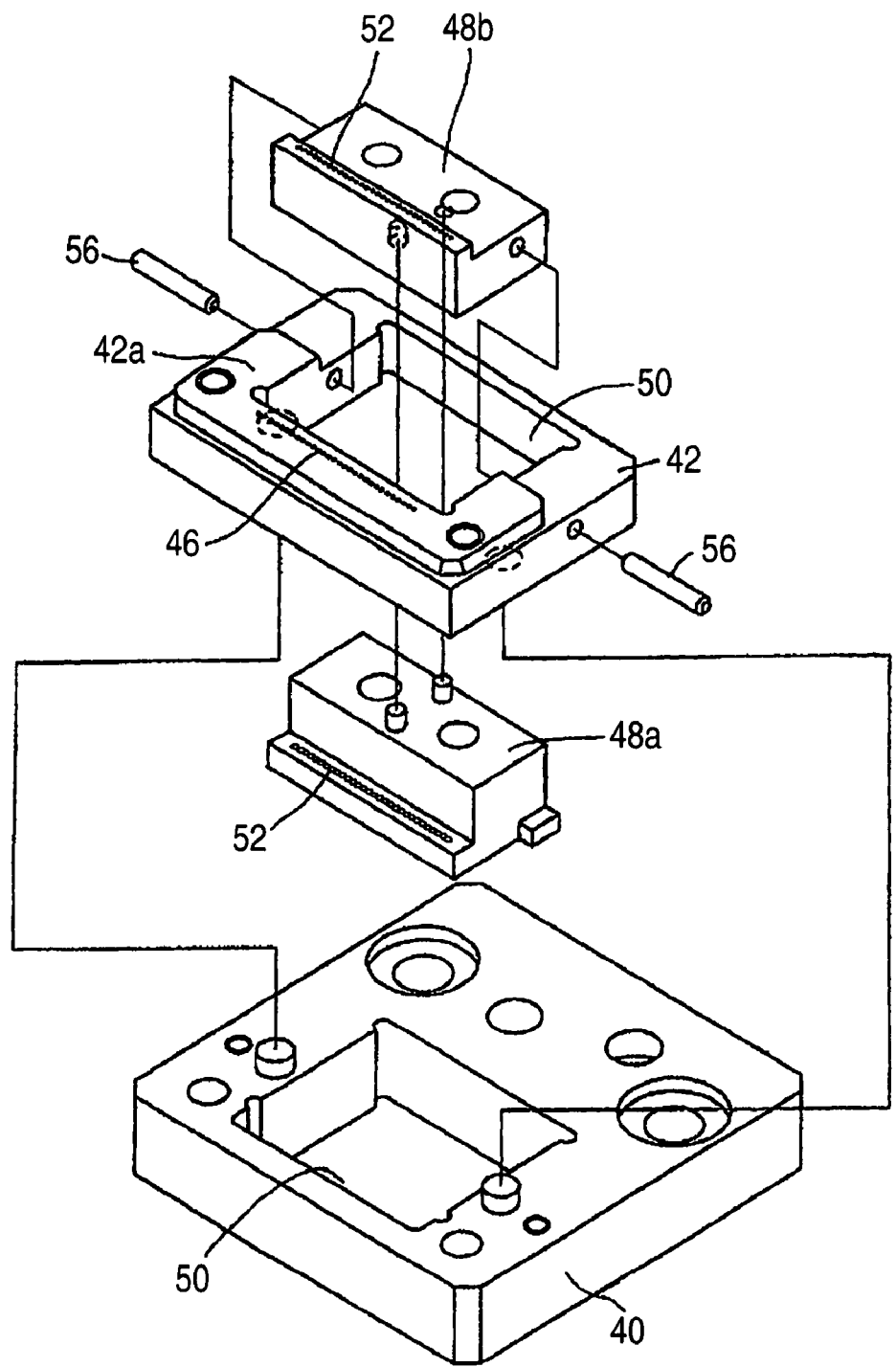
FIG. 6 is an exploded perspective view of the pin block.
Figure 7:
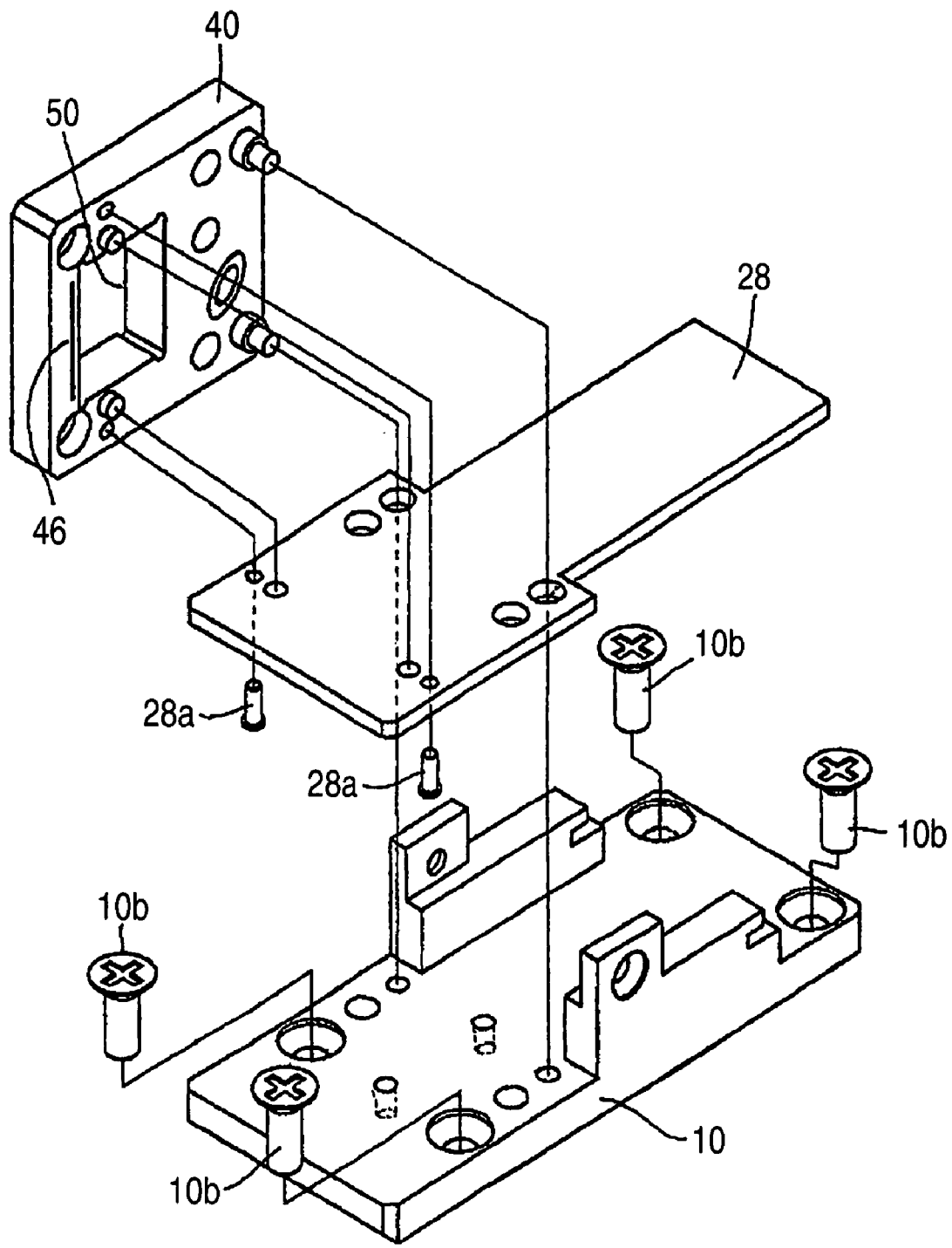
FIG. 7 is an exploded perspective view of the lower pin block, a wiring board, and a base member.

The floating guide 26 can move linearly in a vertical direction in FIGS. 1 and 3, in association with the swing motion of the distal end portion of the pressure operating member 14 between the open state in which the distal end portion is opened and the pressed state in which the distal end portion is closed. For this purpose, the pin block 24 is uprightly provided with a linear shaft 30a in a vertical direction, and the floating guide 26 is provided with a linear tube member 30b in a vertical direction, into which the linear shaft 30a is inserted so as to slide in an axial direction. This linear movement is realized by a linear guide 30 which includes the linear shaft 30a and the linear tube member 30b. A floating pin 32 having swelled parts at both ends is passed through the pin block 24 and the floating guide 26 in the vertical direction. A distance between the swelled parts at the both ends of the floating pin 32 can be adjusted by screwing an adjusting screw 32a which is provided at its one end. Further, a float spring 34 which is idly fitted to the floating pin 32 is provided between the pin block 24 and the floating guide 26 in a contracted state, and resiliently urges the floating guide 26 so as to separate it from the pin block 24. Accordingly, by adjusting the floating pin 32, the distance of the floating guide 26 to be separated from the pin block 24 is restricted as desired, and that, the floating guide 26 is urged by contracted resilience of the float spring 34, and kept in a state separated from the pin block 24 in the open state of the pressure operating member 14.

The floating guide 26 is provided with a board mounting face 26a on which a board 36 which is to be inspected is mounted. This board mounting face 26a is formed with a guide hole 26b into which a connector 38 to be inspected which is arranged on the board for inspection can be inserted and engaged. An outer peripheral wall of the connector 38 to be inspected is butted against an inner peripheral wall of this guide hole 26b, thereby to position the inserted connector 38 to be inspected. The board mounting face 26a around this guide hole 26b has no such structure for restricting the position of the board 36 for inspection which has been mounted thereon, but has a sufficiently large flat face. The floating guide 26 is further provided with a concave part 26c, having its center substantially aligned with the guide hole 26b, on its face opposed to the pin block 24 at a back side of the board mounting face 26a. The board mounting face 26a is formed by cutting or so, while being adjusted so that a distance between a bottom face of the concave part 26c and the board mounting face 26a, that is, a depth of the guide hole 26b may be equal to a height of the connector 38 to be inspected. In addition, reinforcing ribs 26d for increasing mechanical strength are provided on the back face of the board mounting face 26a at both ends thereof.

Figure 8:
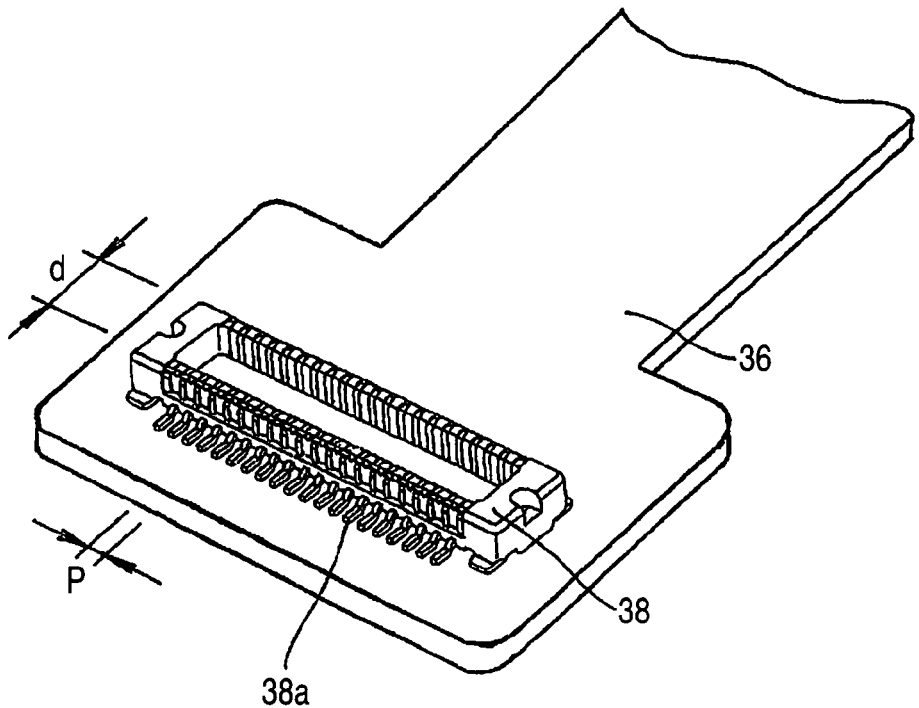
FIG. 8 is a perspective view of an outer appearance of a connector to be inspected which is provided on a board for inspection which is inspected by the relay connector according to the invention.

The pin block 24 includes a lower pin block 40 and an upper pin block 42 which are integrally fixed to each other with screws 42b. The upper pin block 42 is provided with a convex part 42a projecting upward, which is so adapted as to be engaged with the concave part 26c of the floating guide 26 so that the pin block 24 and the floating guide 26 can be relatively positioned. Moreover, a number of probe holes 46 passing through the lower pin block 40 and the upper pin block 42 in the vertical direction are formed in a row. Further, an insertion hole 50 into which a position adjusting block 48 formed of insulating material is inserted is formed passing through the lower pin block 40 and the upper pin block 42 in the vertical direction. The position adjusting block 48 also includes a lower position adjusting block 48a and an upper position adjusting block 48b which are integrally fixed to each other by appropriate means, and a number of probe holes 52 passing through them in the vertical direction are formed in a row. The position adjusting block 48 is adjusted inside the insertion hole 50 so that positions of the probe holes 52 may be at an appropriate distance from the probe holes 46 which are formed in the lower pin block 40 and the upper pin block 42, and fixed with positioning pins 56. It is to be noted that the position adjusting block 48 is set in the insertion hole 50 so as to move only in a direction of adjusting the distance between the probe holes 46 and 52, but cannot move in a direction perpendicular to this direction. Each of the probe holes 46, 52 has a neck portion at its upper end so that a probe 54 can be appropriately inserted from below, but cannot escape upward. It is apparent that the probe holes 46, 52 are formed at a pitch corresponding to a pitch P of terminals 38a of the connector 38 to be inspected as shown in FIG. 8. Further, it is also apparent that the distance between the probe holes 52 in the position adjusting block 48 and the probe holes 46 in the lower pin block 40 and the upper pin block 42 is appropriately adjusted so as to correspond to a distance d between two rows of the terminals 38a of the connector 38 to be inspected. Moreover, appropriate numbers of the probes 54 are inserted into the probe holes 46, 52 from below, at appropriate positions corresponding to the terminals 38a of the connector 38 to be inspected.

Figure 9:
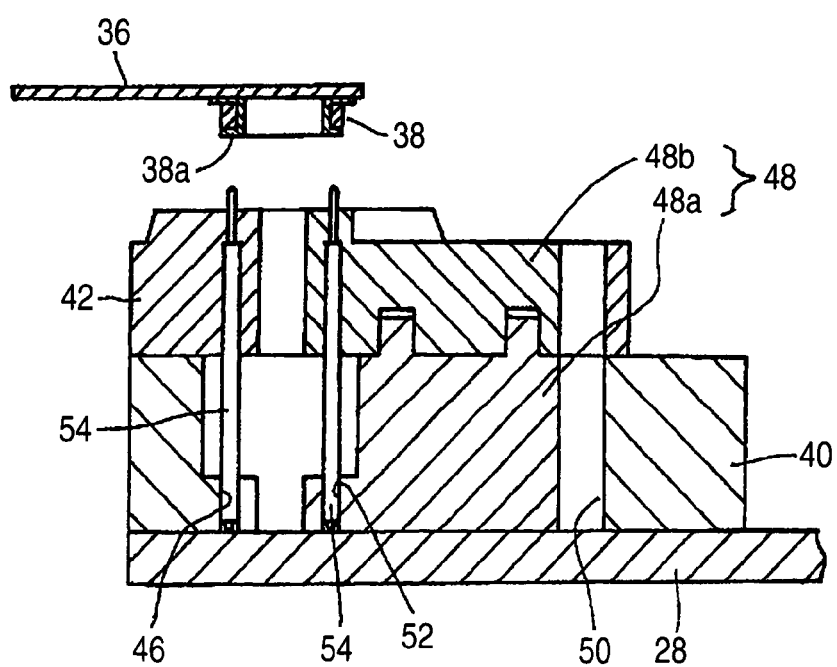
FIG. 9 is a vertical sectional view of the pin block.
Figure 10:
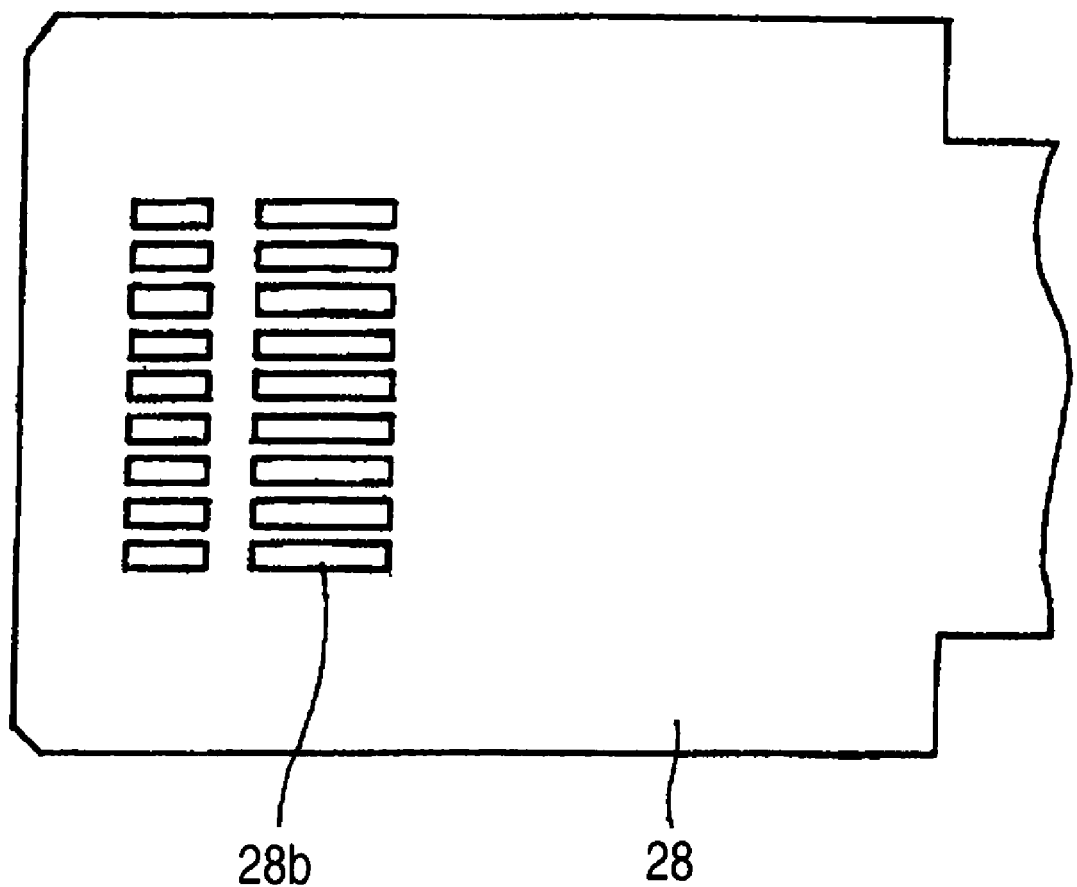
FIG. 10 is a view showing a terminal pattern which is provided on the wiring board.
Figure 11:
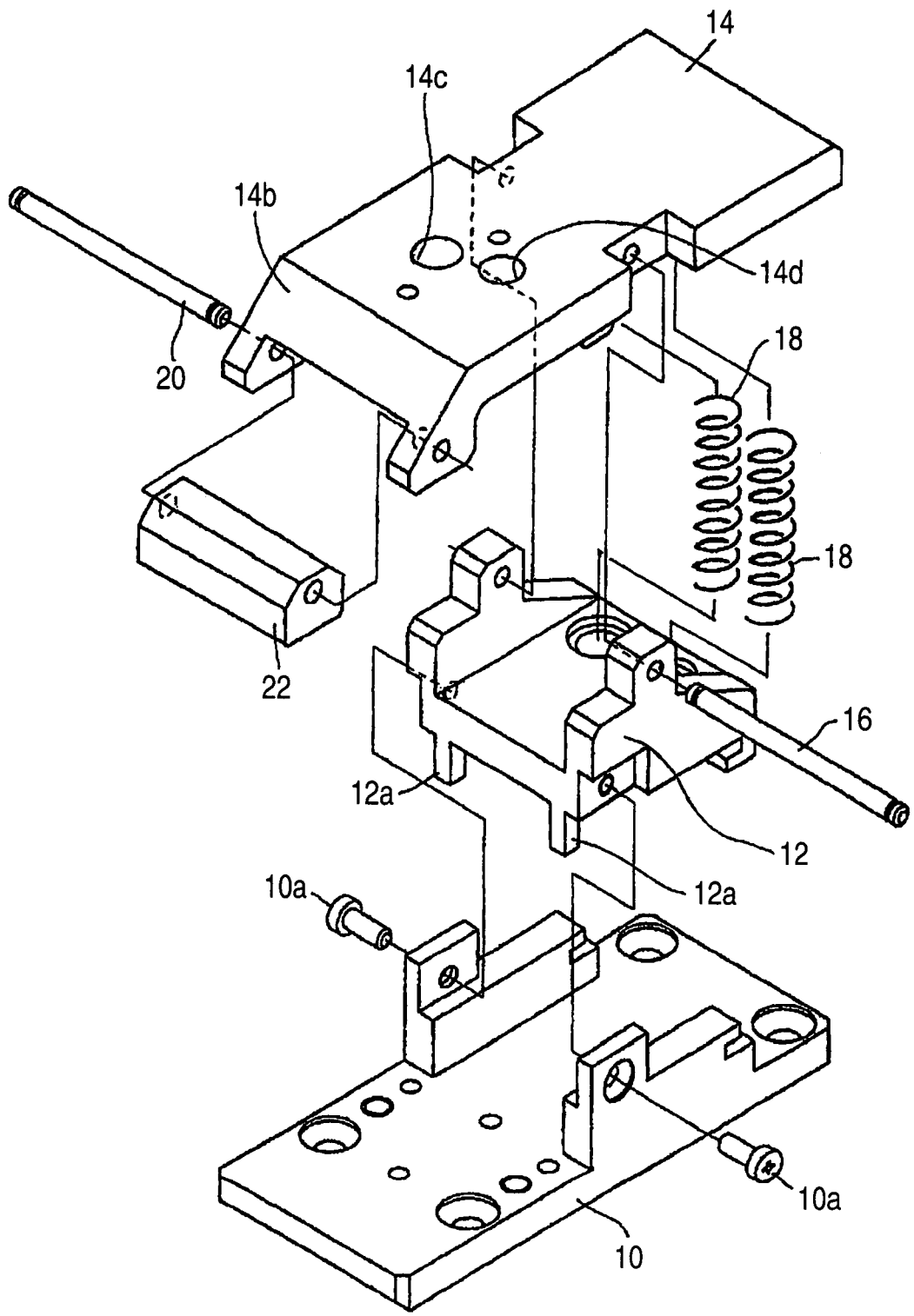
FIG. 11 is an exploded perspective view of a pressure operating member, a hinge member, and the base member.
Figure 12:
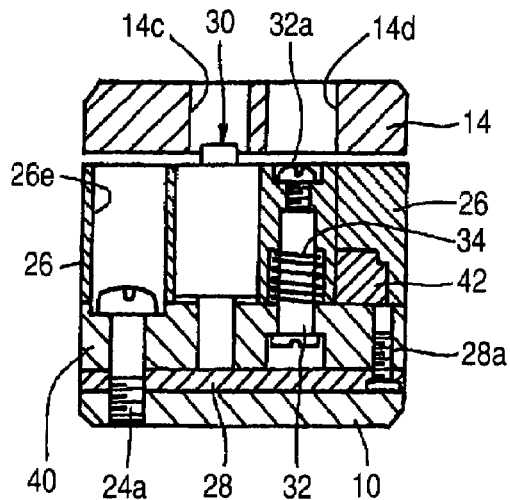
FIG. 12 is a sectional view as seen in a direction of arrow marks A-A in FIG. 2.

The wiring board 28 is integrally fixed to the pin block 24 which has the probes 54 inserted in the probe holes 46, 52, by arranging it from below and by screwing the screws 28a from below. By fixing the wiring board 28 in this manner, the probes 54 will not escape from the probe holes 46, 52. Then, the pin block 24 having the wiring board 28 fixed thereto is fixed to the base member 10 with the screws 24*a* from above. It is also possible to appropriately fix the base member 10 to an inspecting jig or the like which is not shown, in advance, with fixing screws 10*b*. As shown in FIG. 9, plungers of the probes 54 which have been inserted into the probe holes 46, 52 can be brought into contact with the terminals 38*a* of the connector 38 to be inspected which are shown in FIG. 8. A terminal pattern 28*b* provided on the wiring board 28 is formed longer in a moving direction of the position adjusting block 48 so that, the terminal pattern 28*b* can be brought into contact with the plungers of the probes 54, even though the position adjusting block 48 has been moved.

Figure 13A:
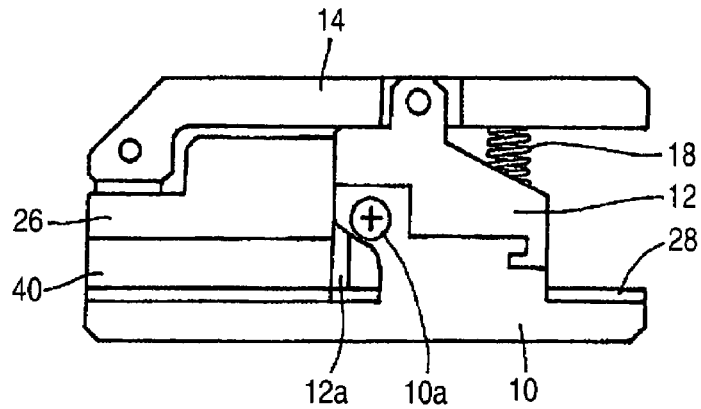
Figure 13B:
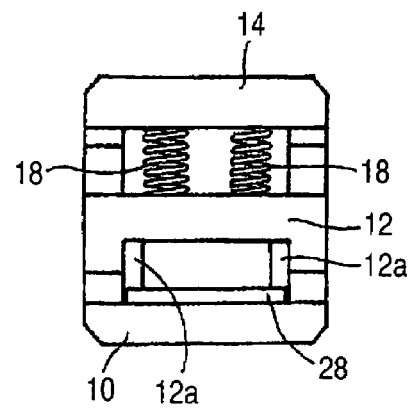

Further, the pressure operating member 14 which is provided so as to swing on the hinge member 12 is restrained by the hinge member 12 from moving in a swinging direction to be shifted into the open state. The aforesaid engaging projection 14*a* is so adapted as to be engaged with the engage receiving part 26*f*, in a state where the movement in the swinging direction into the open state is restrained. Moreover, the hinge member 12 is provided with ribs 12*a* as shown in FIGS. 13A and 13B, which act on the wiring board 28 to push it toward the base member 10, and restrain the wiring board 28 from floating up from the base member 10.

The pressure operating member 14 is provided with a hole 14*c* and an adjusting hole 14*d* so as to be respectively opposed to the linear guide 30 and the floating pin 32. The floating guide 26 is provided with holes 26*e* so as to be opposed to the screws 24*a* for fixing the pin block 24 having the wiring board 28 fixed thereto to the base member 10. Further, an upper part of the distal end portion of the pressure operating member 14 is chamfered to form a slant face 14*b*. The relay connector in the first embodiment according to the invention has a height of 27 mm, a width of 26 mm and a length of 60 mm in its outer shape, and can be held by hand to conduct inspecting work.

In the above described structure, the pressure operating member 14 is operated to swing against the resilience of the compression spring 18, and shifted into the open state. Then, the board 36 for inspection is mounted on the board mounting face 26*a* of the floating guide 26, and the connector 38 to be inspected is inserted into the guide hole 26*b* to be engaged. By thus inserting and engaging into the guide hole 26*b*, positioning of the connector 38 to be inspected is performed. On this occasion, a force for positioning the board 36 for inspection is not applied to the board 36 itself, and no force for displacing the position of the connector 38 to be inspected sideward with respect to the board 36 for inspection will be exerted. While the pressure operating member 14 is maintained in the open state, the engaging projection 14*a* of the pressure operating member 14 is engaged with the engage receiving part 26*f* of the floating guide 26. Therefore, the floating guide 26 is separated from the pin block 24 and will not move toward the pin block 24 unexpectedly. As the results, there is no such anxiety that during the work for inserting the connector 38 to be inspected into the guide hole 26*b*, the floating guide 26 moves downward by mistake, and the probes 54 are brought into contact with the connector 38 to be inspected in an improper posture, whereby either of the connector 38 to be inspected and the probes 54 may be broken. When the pressure operating member 14 is shifted into the pressed state by closing the distal end portion by the resilience of the compression spring 18, the floating guide 26 is linearly moved toward the pin block 24 by the linear guide 30, and the plungers of the probes 54 are brought into contact with the terminals 38*a* of the connector 38 to be inspected. On this occasion, the concave part 26*c* of the floating guide 26 is engaged with the convex part 42*a* of the pin block 24, whereby the floating guide 26 and the pin block 24 are reliably positioned with respect to each other. As the results, the connector 38 to be inspected is positioned with respect to the pin block 24, and the terminals 38*a* are positioned with respect to the probes 54. It is apparent that the resilience of the compression spring 18 for urging the pressure operating member 14 into the pressed state is set to be larger than the resilience of the float spring 34 for separating the floating guide 26 from the pin block 24. Besides, because the depth of the guide hole 26*b* in the floating guide 26 is so set as to be equal to the height of the connector 38 to be inspected, the face of the connector 38 to be inspected which has been inserted into the guide hole 26*b* at the side opposed to the pin block 24 lies on the same plane as the bottom face of the concave part 26*c*. By providing the probes 54 in such a manner that a projecting height of the plungers may be optimum, making the bottom face of the concave part 26*c* as the base, the plungers of the probes 54 can be brought into contact with the terminals 38*a* of the connector 38 to be inspected with appropriate resilience.

The pressure operating member 14 is so constructed as to swing between the open state and the pressed state by means of the swing shaft 16, and has the relatively simple structure. Besides, the pressure block 22 is provided at the distal end side of the pressure operating member 14 by means of the second swing shaft 20, and so, the floating guide 26 can be accurately pressed by this pressure block 22 in a direction of approaching the pin block 24.

By the way, for the purpose of arranging the relay connector according to the invention in alignment with the connector 38 to be inspected having various different sizes, the size and depth of the guide hole 26*b* in the floating guide 26 is appropriately adjusted and set depending on the connector 38 to be inspected, as a first step. The depth of the guide hole 26*b* can be adjusted by adequately cutting the board mounting face 26*a*. In the pin block 24 too, the distance between the two rows of the probe holes 46 and 52 is made equal to the distance d between the two rows of the terminals 38*a* of the connector 38 to be inspected, by appropriately setting the position of the position adjusting block 48 to be fixed inside the insertion hole 50. This can be done by drilling holes for inserting the positioning pins 56 at accurate positions. It is apparent that the probes 54 must be inserted into the probe holes 46, 52 so as to be opposed to the terminals 38*a* of the connector 38 to be inspected. In this manner, the invention provides relatively easy work in arranging the relay connector in alignment with the connector 38 to be inspected with various different sizes, by preparing the respective members just before the final process, in advance. Accordingly, the work can be rapidly conducted, as compared with the case where the respective members are newly produced.

The distance of the floating guide 26 moving in the separating direction from the pin block 24 can be arbitrarily adjusted by means of the floating pin 32. In case where the distance of the floating guide 26 moving in the separating direction from the pin block 24 has changed due to long use, a screwed and inserted state of the adjusting screw 32*a* of the floating pin 32 may be adjusted by appropriately inserting a tool through the adjusting hole 14*d* which is formed in the pressure operating member 14. In case where the probes 54 are broken and must be exchanged, the hinge member 12 in a state when the pressure operating member 14 is attached therewith is detached from the base member 10, and the screws 24*a* are removed from the base member 10, by inserting a tool through the holes 26*e* which are formed in the floating guide 26. Then, the pin block 24 which has been detached is turned upside down having the wiring board 28 placed on an upper side, and the wiring board 28 is detached from the pin block 24, by removing the screws 28a. Thereafter, only the probes 54 that must be exchanged may be taken out of the probe holes 46, 52 and exchanged.

Figure 14:
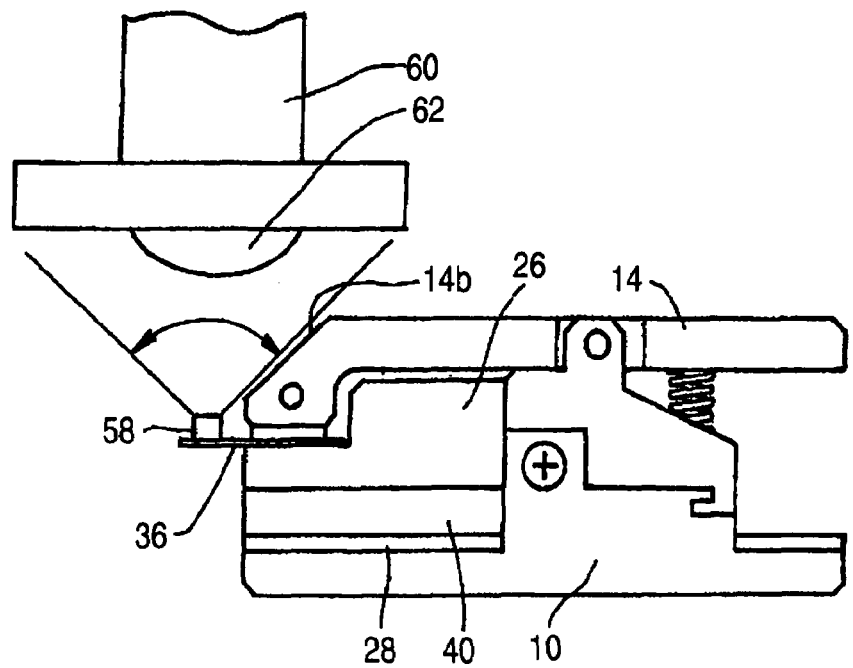
FIG. 14 is a view for explaining function of a slant face which is formed by chamfering an upper part of a distal end of the pressure operating member.
Figure 15:
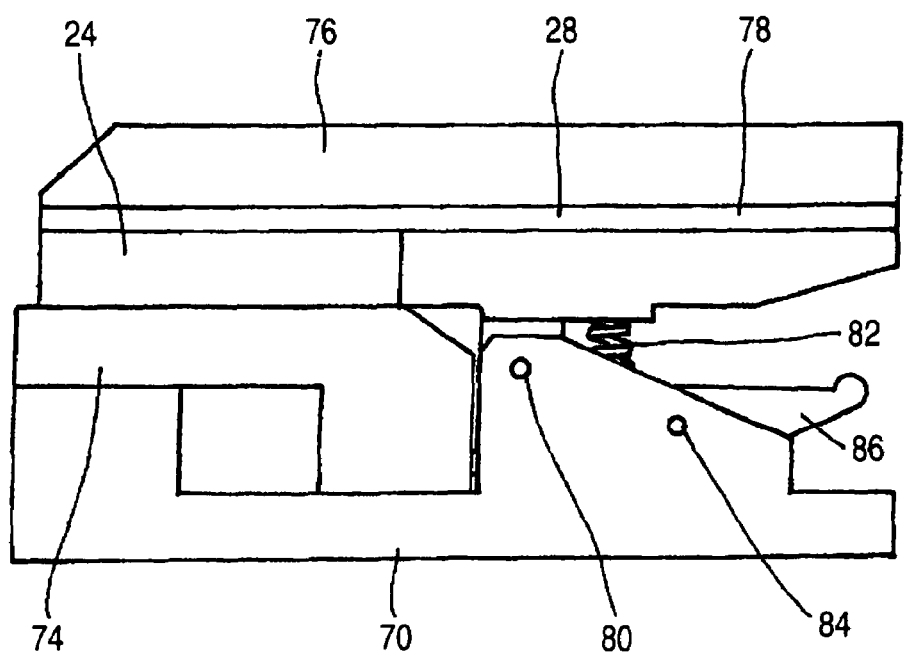
FIG. 15 is a side view of a relay connector in a pressed state, in a second embodiment according to the invention.
Figure 16:
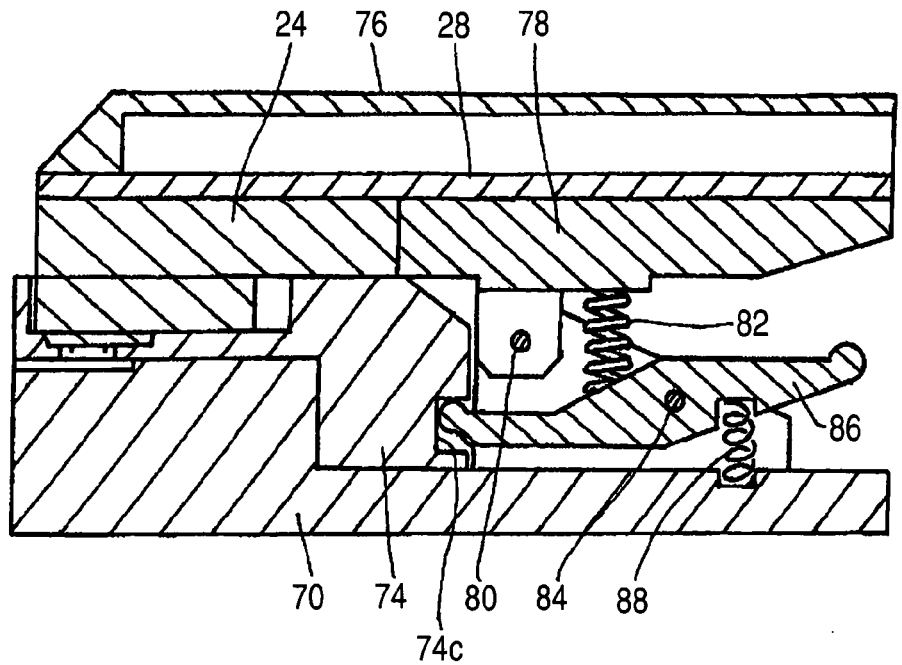
FIG. 16 is a vertical sectional view of FIG. 15.
Figure 17:
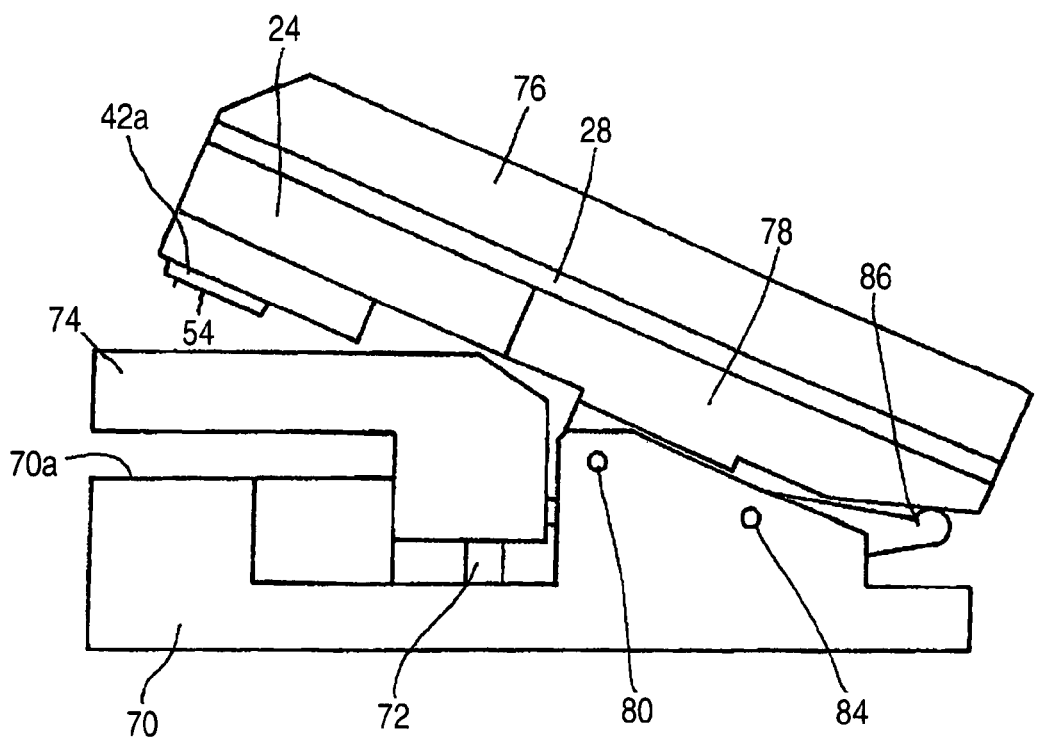
FIG. 17 is a side view of FIG. 15 in an open state.
Figure 18:
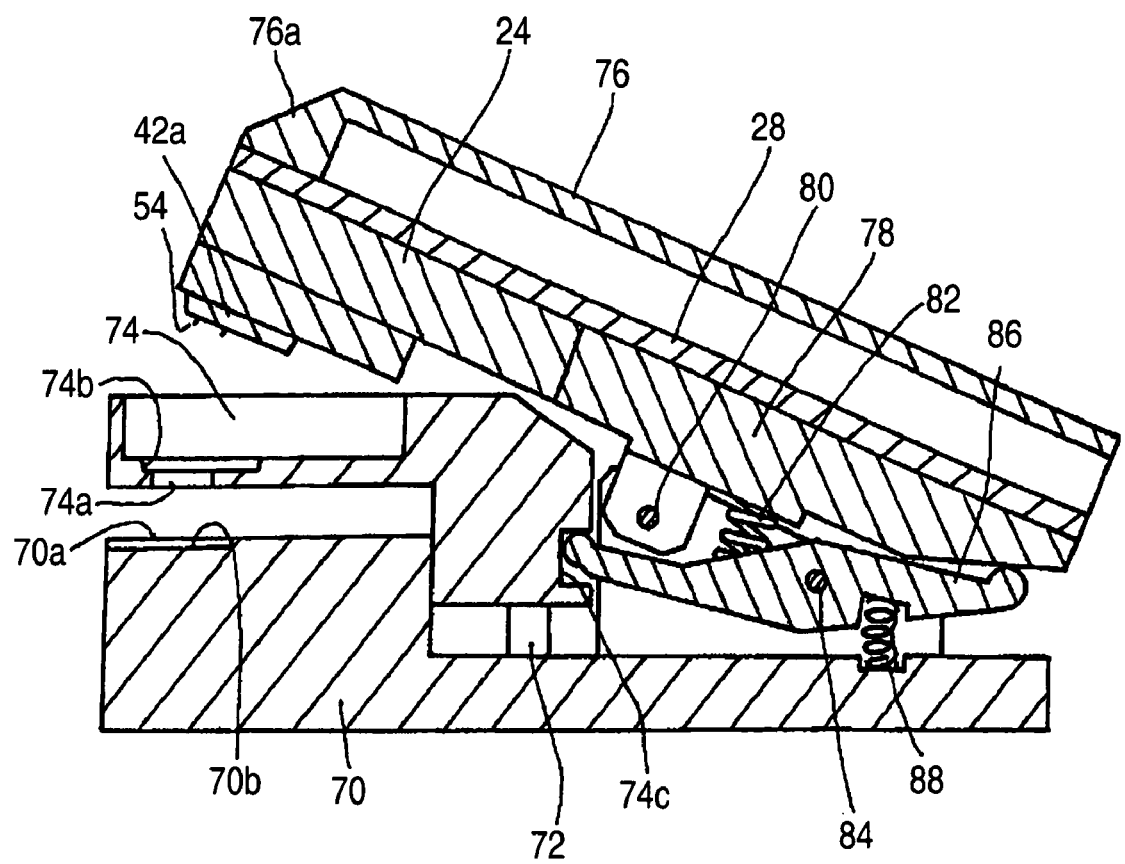
FIG. 18 is a vertical sectional view of FIG. 17.
Figure 19:
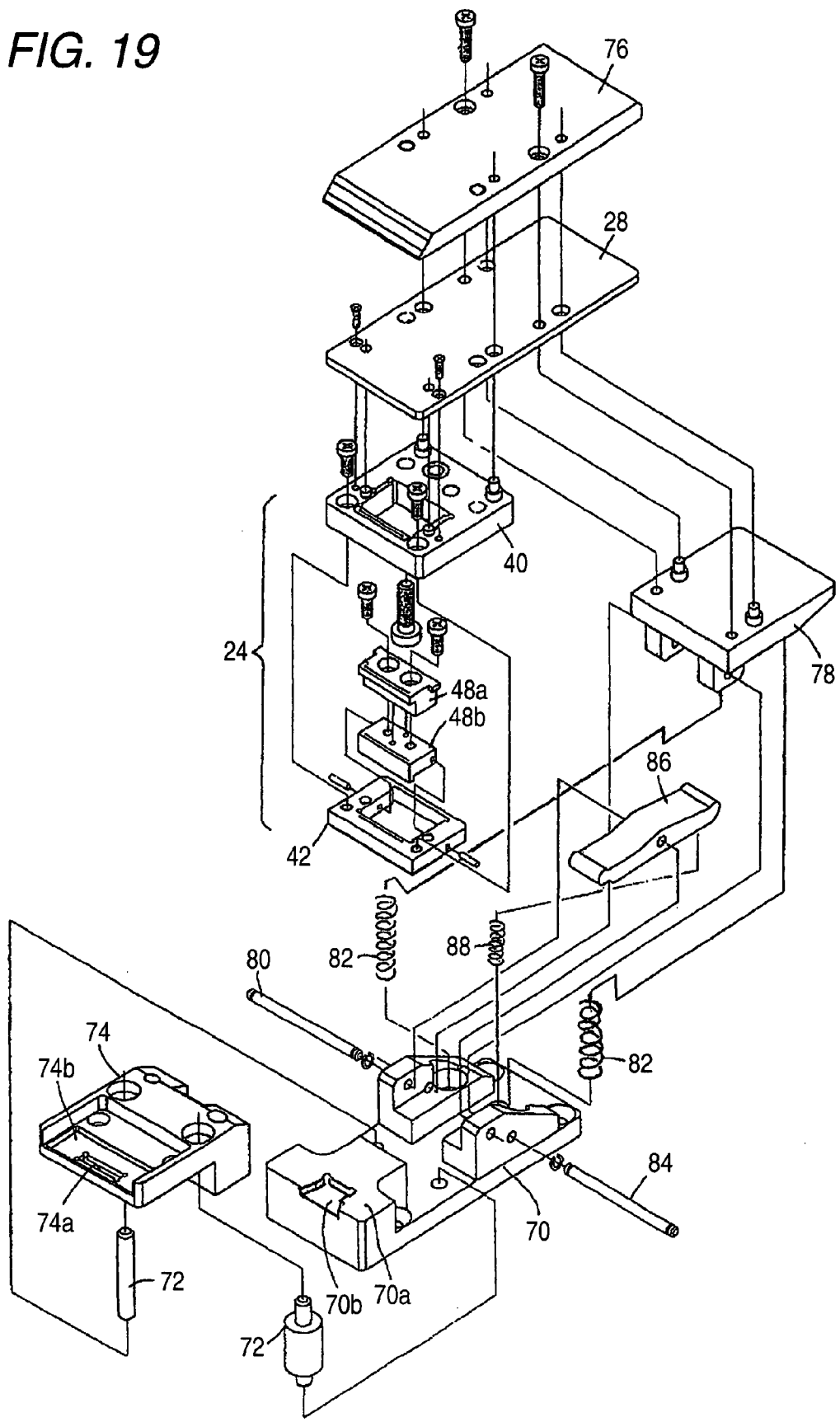
FIG. 19 is an exploded perspective view of FIG. 15.

There is such anxiety that the wiring board 28 which is fixed to the pin block 24 with the screws 28a may be distorted with soldering heat or so, and its backward end may float from the base member 10. For avoiding such anxiety, the wiring board 28 is so constructed as to be pushed toward the base member 10 by means of the ribs 12a which are provided on the hinge member 12. Moreover, in case where the board 36 for inspection is a camera module, a CCD camera element 58 is disposed on the board 36 for inspection at the other end thereof, that is, at the opposite side to the side where the connector 38 to be inspected is provided. In some cases, the CCD camera element 58 is positioned relatively close to the connector 38 to be inspected, as shown in FIG. 14. Because the slant face 14b is formed by chamfering the outside part of the pressure operating member 14 at the distal end side opposed to the floating guide 26, a field of view above the CCD camera element 58 is widely opened. As the results, it is possible to direct this CCD camera element 58 to a lens 62 which is provided in an inspection unit 60 for inspecting the CCD camera element 58, without any obstacle in the field of view.

Then, a second embodiment of the invention will be described referring to FIGS. 15 to 21. In FIGS. 15 to 21, the members which are the same as or equivalent to those members as shown in FIGS. 1 to 14 will be denoted with the same reference numerals, and overlapped descriptions will be omitted.

In FIGS. 15 to 21, the relay connector in the second embodiment of the invention is constructed as follows. A floating guide 74 formed of insulating material is arranged so as to approach and separate in a vertical direction with respect to a board mounting face 70a which is provided at a distal end side of a base member 70 formed of insulating material, by means of linear guides 72, 72 which are uprightly provided on the base member 70. Moreover, a pin block 24 is fixed to a distal end side of a pressure operating member 76 formed of insulating material with screws or the like, interposing a wiring board 28, and a hinge block 78 formed of insulating material is fixed to a back end side of the pressure operating member 76 with screws or the like. Then, a first swing shaft 80 provided on the base member 70 is passed through the hinge block 78, whereby the pressure operating member 76 is arranged so as to swing. In this case, the pin block 24 is opposed to the floating guide 74 which is provided on the base member 70. In addition, compression springs 82, 82 are provided in a contracted state between the hinge block 78 and the base member 70, thereby to resiliently urge the pin block 24 in a direction of coming into contact with the floating guide 74. Further, a lever member 86 is provided on the base member 70 so as to swing by means of a second swing shaft 84 which is provided in parallel with the first swing shaft 80. One end of this lever member 86 is engaged with an engaging recess 74c formed in the floating guide 74, and the other end of the lever member 86 is pressed by the hinge block 78 with swing motion of the pressure operating member 76 which allows the pin block 24 to swing in the separating direction from the floating guide 74, whereby the lever member 86 is allowed to swing. Still further, a lever pressing spring 88 is provided in a contracted state between the lever member 86 and the base member 70, whereby the floating guide 74 is resiliently urged in a direction of coming into contact with the base member 70. Besides, an outside part of the pressure operating member 76 at a distal end side where the pin block 24 is provided is chamfered to form a slant face 76a.

A board positioning recess 70b which has a shape corresponding to a distal end part at an inserting side of the board 36 for inspection is provided on the board mounting face 70a of the base member 70 starting from an edge of the board mounting face 70a. This board positioning recess 70b is enlarged in width in a tapered shape toward the edge so that the board 36 for inspection can be easily inserted. Then, the board 36 for inspection is positioned with respect to the base member 70, while insertion length and sideward displacement are restricted by this board positioning recess 70b. At a position opposed to the connector 38 to be inspected which is provided on the board 36 for inspection and is directed upward, the floating guide 74 is formed with a guide hole 74a into which the connector 38 to be inspected can be inserted. The floating guide 74 is further provided with a concave part 74b at a side opposed to the pin block 24, having its center substantially aligned with the guide hole 74a. Herein, the guide hole 74a is formed in such a manner that its depth is equal to the height of the connector 38 to be inspected. Although structure of the pin block 24 is substantially the same as in the first embodiment, the second embodiment is different from the first embodiment in that the probes 54, 54 are disposed on the pressure operating member 76 so as to protrude toward the floating guide 74. Moreover, substantially in the same manner as in the first embodiment, the pin block 24 is formed with a convex part 42a to be engaged with the concave part 74b which is provided in the floating guide 74.

Figure 20:
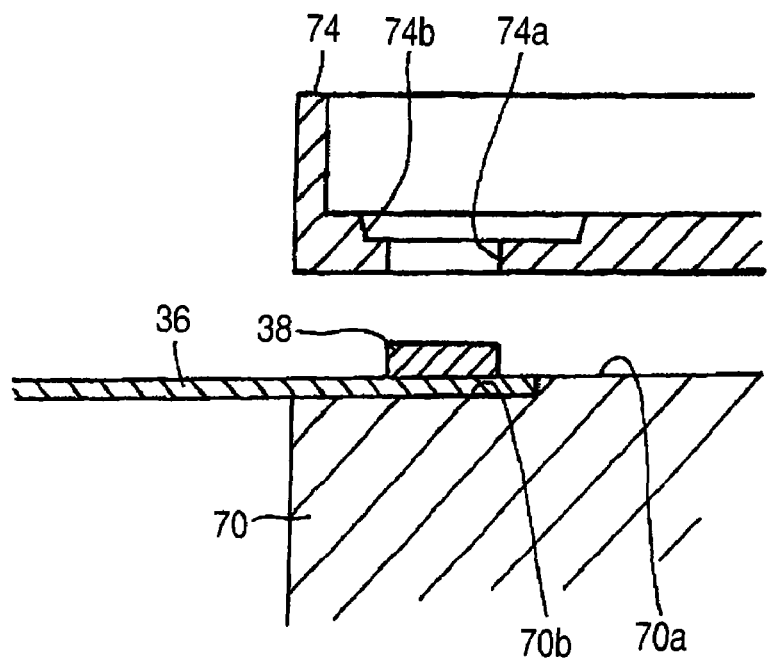
FIG. 20 is an enlarged vertical sectional view of a part in the second embodiment showing the open state in which a board for inspection is inserted.
Figure 21:
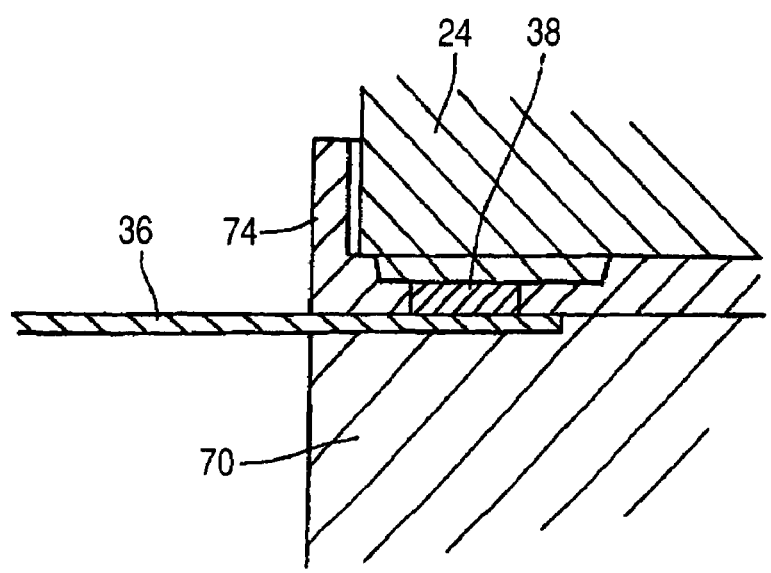
FIG. 21 is an enlarged vertical sectional view of the part in the second embodiment showing the pressed state in which the board for inspection is inserted and pressed.

In the second embodiment having the above described structure, when the hinge block 78 at the back end side of the pressure operating member 76 is pushed against resilience of the compression springs 82, 82, the pressure operating member 76 swings thereby to move the pin block 24 at the front end side in a direction of separating from the base member 70. Accordingly, the other end portion of the lever member 86 is pressed by the hinge block 78 to swing against the resilience of the lever pressing spring 88, whereby the floating guide 74 engaged with the one end of the lever member 86 is moved in a direction of separating from the base member 70 to be shifted into the open state. Then, the board 36 for inspection is inserted between the base member 70 and the floating guide 74, as shown in FIG. 20, and positioned by the board positioning recess 70b. In this state, the connector 38 to be inspected is opposed to the floating guide 74. By releasing pressure on the pressure operating member 76 in this state, the pressure operating member 76 swings due to the resilience of the compression springs 82, 82, allowing the pin block 24 at the front end side to be contacted with the floating guide 74. At the same time, the lever member 86 also swings due to the resilience of the lever pressing spring 88, and the floating guide 74 moves to be contacted with the base member 70. Then, the connector 38 to be inspected provided on the board 36 for inspection is inserted into the guide hole 74a in the floating guide 74, and the probes 54, 54 on the pin block 24 are brought into contact with the terminals 38a, 38a . . . of the connector 38 to be inspected to be electrically connected.

In this second embodiment, by arranging the base member 70 at a lower side, it is possible to inspect the connector 38 to be inspected in a state when the connector 28 is mounted on an upper side of the board 36 for inspection. Moreover, the inserting length and sideward displacement of the board 36 for inspection with respect to the base member 70 is restricted by the board positioning recess 70b formed on the board mounting face 70a of the base member 70, whereby the board 36 for inspection can be positioned with respect to the base member 70. Further, the floating guide 74 is arranged so as to be contacted with and separated from the board mounting face 70a in the vertical direction by the linear guides 72, 72. Therefore, the guide hole 74a in the floating guide 74 is relatively positioned with respect to the connector 38 to be inspected which is provided on the board 36 for inspection, and thus, the connector 38 to be inspected can be accurately inserted into the guide hole 74a along with the approach and contact of the floating guide 74. In this case, because the floating guide 74 is moved to approach and separate in the vertical direction with respect to the board mounting face 70a, no force for displacing the connector 38 to be inspected sideward will be exerted, when the connector 38 to be inspected is inserted into the guide hole 74a, and no force for displacing the connector 38 to be inspected sideward with respect to the board 36 for inspection will be exerted. Further, the pressure operating member 76 is so constructed as to swing with respect to the base member 70, and has a simple structure. Besides, when the pressure on the pressure operating member 76 is released after the board 36 for inspection has been inserted, the pressed state in which the pin block 24 is pressed to the connector 38 to be inspected is maintained due to the resilience of the compression springs 82, 82, and pressure exerting operation is not required during measurement. In this manner, the operation can be easily done. Still further, when the pressure operating member 76 is pressed to swing, in association with this swing motion, the floating guide 74 moves in the direction of separating from the base member 70, and the board 36 for inspection can be easily inserted. Moreover, while the pressure operating member 76 is operated to exert pressure, the floating guide 74 can be reliably restrained from moving toward the base member 70 by action of the lever member 86.

In the second embodiment, in the open state where the pressure operating member 76 is operated to exert pressure, the floating guide 74 is restrained from moving toward the base member 70 by the lever member 86. However, the invention is not limited to this. Alternatively, a spring for resiliently urging the floating guide 74 in a direction of separating from the base member 70 may be provided in a contracted state between the floating guide 74 and the base member 70, so that the floating guide 74 may move in the separating direction from the base member 70 by resilience of this spring when the pressure operating member 76 is shifted to the open state, permitting insertion of the board 36 for inspection between the floating guide 74 and the base member 70.

According to an aspect of the invention, the connector to be inspected is positioned by inserting it toward the pin block into the guide hole in the floating guide which is resiliently urged and separated from the pin block in the open state of the pressure operating member, and in this state, the pressure operating member is operated into the pressed state in which the floating guide and the connector to be inspected are pressed toward the pin block. Therefore, when the connector to be inspected is inserted into the guide hole and positioned, it will not happen that the connector to be inspected is contacted with the probes in improper posture, and that a force for relatively displacing the connector to be inspected sideward in a state contacted with the probes is exerted. As the results, the probes or the connector to be inspected will not be broken.

According to an aspect of the invention, the pressure operating member is provided with the engaging projection, and the floating guide is provided with the engage receiving part, wherein the engaging projection is engaged with the engage receiving part in the open state of the pressure operating member thereby to restrain the floating guide from moving toward the pin block. Therefore, when the connector to be inspected is inserted into the guide hole in the floating guide, even though a force directed to the pin block is applied to the floating guide, the floating guide will not move, and the connector to be inspected which is not correctly positioned will not be contacted with the probes. As the results, the probes or the connector to be inspected will not be broken.

According to an aspect of the invention, because the pressure operating member is arranged so as to swing between the open state and the pressed state by means of the swing shaft, the structure for arranging the pressure operating member is simple. In addition, because the pressure block is arranged at the distal end side where the connector to be inspected is pressed so as to swing by means of the second swing shaft which is parallel to the swing shaft, the floating guide can be accurately pressed in a direction of approaching the pin block.

According to an aspect of the invention, the distance of the floating guide moving from the pin block in the separating direction is restricted by the floating pin which has the swelled parts at the both ends. Besides, the floating guide is resiliently urged in the separating direction by the float spring, and can be separated from the pin block, in the open state of the pressure operating member.

According to an aspect of the invention, because the distance of the floating pin moving in the separating direction is adjusted by the adjusting screw which is screwed over its one end, the distance that the floating guide can be separated from the pin block can be set as desired. In addition, because the adjusting hole is formed in the pressure operating member opposed to the adjusting screws the adjusting screw can be easily readjusted from the exterior, when it is loosened during use.

According to an aspect of the invention, the board mounting face of the floating guide on which the connector to be inspected is inserted into the guide hole toward the pin block has the flat face which is larger than the board for inspection, and no positional restriction is applied to the board for inspection, in a state where the connector to be inspected has been inserted into the guide hole. Therefore, even though the connector to be inspected is mounted on the board for inspection at a displaced position, no force for displacing the connector to be inspected sideward with respect to the board for inspection will be applied from anywhere, and no inconvenience will happen in the inspection.

According to an aspect of the invention, the restraining part for restraining the pressure operating member from swinging into the open state is provided, and the engaging projection is adapted to be engaged with the engage receiving part in a state where the pressure operating member is restrained by the restraining part. Therefore, when the pressure operating member is restrained in the open state, the engaging projection is engaged with the engage receiving part, whereby the floating guide is reliably restrained from moving toward the pin block.

According to an aspect of the invention, in a state where the board for inspection has been inserted between the base member and the floating guide, the connector to be inspected is positioned by inserting it into the guide hole which is formed in the floating guide, and the pin block is contacted with the floating guide so that the probes may be brought into contact with the terminals of the connector to be inspected which has been inserted into the guide hole. Therefore, provided that the base member is arranged at a lower side, the connector to be inspected can be inspected in a state when the connector is arranged on an upper side of the board for inspection.

According to an aspect of the invention, the board positioning recess having a shape corresponding to the distal end portion of the board for inspection at the inserting side is formed on the board mounting face of the base member starting from the edge part thereof, whereby the insertion length and the sideward displacement of the board for inspection are restricted by the board positioning recess thereby to position the board for inspection. As the results, the connector to be inspected which is arranged on the board for inspection can be relatively positioned with respect to the guide hole formed in the floating guide.

According to an aspect of the invention, the floating guide is guided by the linear guide which is provided on the base member, and adapted to be contacted with and separated from the board mounting face of the base member in a vertical direction. Therefore, when the connector to be inspected is inserted in the guide hole formed in the floating guide, no force for displacing the connector to be inspected sideward will be applied, and hence, no force for displacing the board for inspection provided with the connector to be inspected sideward will be applied.

According to an aspect of the invention, the pressure operating member is arranged so as to swing in such a manner that its side opposed to the floating guide may approach and separate with respect to the base member, and the compression spring is provided in a contracted state between the pressure operating member and the base member so as to resiliently urge the pressure operating member in a direction in which the side of the pressure operating member opposed to the floating guide approaches the base member. Therefore, the structure of the relay connector is simple. Besides, while the pressure operating member is operated to exert pressure, the open state is maintained, permitting insertion of the board for inspection, and when the pressure exerting operation is released, measurement can be conducted in the pressed state in which the pin block is pressed to the connector to be inspected. In this manner, the pressure exerting operation is not required during the measurement, and the operation can be easily done.

According to an aspect of the invention, in association with the swing motion of the pressure operating member at the side opposed to the floating guide, the floating guide swings in a direction separating from the base member into the open state. Therefore, the floating guide is separated from the base member during the pressure exerting operation of the pressure operating member, and the insertion of the board for inspection is reliably permitted.

According to an aspect of the invention, because the depth of the guide hole formed in the floating guide is set to be equal to the height of the connector to be inspected, the face of the floating guide opposed to the pin block and the face of the connector to be inspected which has been inserted into the guide hole opposed to the pin block are on the same plane. Therefore, by arranging the probes on the pin block, making this plane as a base, it is possible to resiliently contact the probes with the connector to be inspected with an appropriate force.

According to an aspect of the invention, the floating guide is provided with the concave part on the face opposed to the pin block, and the pin block is provided with the convex part to be engaged with the concave part, on the face opposed to the floating guide, whereby the floating guide and the pin block can be relatively positioned by the engagement between the concave part and the convex part. Therefore, the probes arranged on the pin block can be contacted with the connector to be inspected which has been positioned by means of the guide hole in the floating guide, at proper positions.

According to an aspect of the invention, the outside part of the pressure operating member at the distal end opposed to the floating guide is chamfered to form the slant face. Therefore, on occasion of inspecting a CCD camera element which is arranged adjacent to the connector to be inspected on the board for inspection, the pressure operating member in the relay connector according to the invention will not disturb the inspection.

What is claimed is:

1. A relay connector, adapted to electrically connect a terminal of a connector to be inspected provided on a board for inspection to a measuring instrument, the relay connector comprising:
   a pin block, comprised of insulating material;
   a floating guide, comprised of insulating material, the floating guide arranged so as to approach and separate with respect to the pin block and resiliently urged in a separating direction, the floating guide formed with a guide hole in which the connector to be inspected is inserted so as to position the connector to be inspected toward the pin block;
   a plurality of probes, each of which is provided in the pin block so as to be opposed to the terminal of the connector to be inspected having been inserted into the guide hole, an axial direction of each of which is parallel to an approaching and separating direction of the floating guide; and
   a pressure operating member, adapted to be operated between an open state in which the connector to be inspected is allowed to be inserted into the guide hole in the floating guide, and a pressed state in which the connector to be inspected having been inserted into the floating guide is pressed toward the pin block.

2. The relay connector as claimed in claim 1, wherein the pressure operating member is provided with an engaging projection,
   the floating guide is provided with an engage receiving part, and
   the engaging projection is engaged with the engage receiving part in the open state of the pressure operating member so as to restrain the floating guide from moving toward the pin block.

3. The relay connector as claimed in claim 2, wherein a restraining part for restraining the pressure operating member from swinging into the open state is provided, and
   the engaging projection is adapted to be engaged with the engage receiving part in a state where the pressure operating member is restrained by the restraining part.

4. The relay connector as claimed in claim 1, wherein the pressure operating member is arranged so as to swing between the open state and the pressed state by means of a first swing shaft provided on a plane parallel to a face of the connector to be inspected having been inserted into the guide hole opposed to the pin block, and
   a pressure block is arranged at a distal end side of the pressure operating member for pressing the connector to be inspected so as to swing by means of a second swing shaft parallel to the first swing shaft.

5. The relay connector as claimed in claim 1, wherein a floating pin including swelled parts at both ends thereof is passed through the floating guide and the pin block in the approaching and separating direction of the floating guide,
   a distance of the floating guide moving from the pin block in the separating direction is restricted by the swelled parts, and
   a float spring is idly fitted to the floating pin in a contracted state between the floating guide and the pin block.

6. The relay connector as claimed in claim 5, wherein an adjusting screw is screwed on one end of the floating pin so that the distance in the separating direction can be adjusted, and
the pressure operating member is formed with an adjusting hole so as to be opposed to the adjusting screw, whereby the adjusting screw can be adjusted from the exterior.

7. The relay connector as claimed in claim 1, wherein the floating guide includes a board mounting face by which the connector to be inspected is inserted into the guide hole toward the pin block,
the board mounting face includes a flat face which is larger than the board for inspection, and
no positional restriction is applied to the board for inspection in a state where the connector to be inspected is inserted into the guide hole.

8. The relay connector as claimed in claim 1, wherein a depth of the guide hole formed in the floating guide is set to be equal to a height of the connector to be inspected.

9. The relay connector as claimed in claim 1, wherein the floating guide is provided with a concave part on a face opposed to the pin block,
the pin block is provided with a convex part to be engaged with the concave part, on a face opposed to the floating guide, and
the floating guide and the pin block are relatively positioned by engagement between the concave part and the convex part.

10. The relay connector as claimed in claim 1, wherein an outside part of the pressure operating member at a distal end opposed to the floating guide is chamfered to form a slant face.

11. The relay connector as claimed in claim 1 wherein,
the pin block is formed with probe holes into which the plurality of probes are removably inserted, respectively.

12. A relay connector, adapted to electrically connect a terminal of a connector to be inspected provided on a board for inspection to a measuring instrument, the relay connector comprising:
a base member, comprised of insulating material;
a floating guide, comprised of insulating material, the floating guide arranged so as to approach and separate with respect to the base member, the floating guide formed with a guide hole in which the connector to be inspected is inserted so as to position the connector to be inspected in a state where the board for inspection is inserted between the base member and the floating guide;
a pressure operating member, adapted to sandwich the floating guide between the pressure operating member and the base member, and adapted to approach and separate with respect to the base member;
a pin block, comprised of insulating material, and provided with the pressure operating member so as to be opposed to the floating guide; and
a plurality of probes, each of which is provided on the pin block so as to come into contact with the terminal of the connector to be inspected having been inserted into the guide hole in a state where the pin block is in contact with the floating guide,
wherein the floating guide is adapted to separate from the base member in association with operation or the pressure operating member in a direction of separating the pin block from the floating guide, whereby the pressure operating member is operated between an open state where the connector to be inspected is allowed to be inserted between the base member and the floating guide, and a pressed state where the pin block is pressed toward the connector to be inspected having been inserted into the guide hole in the floating guide.

13. The relay connector as claimed in claim 12, wherein the base member includes a board mounting face opposed to the guide hole of the floating guide,
a board positioning recess having a shape corresponding to a distal end portion of the board for inspection at an inserting side is formed on the board mounting face from an edge part, and
an insertion length and sideward displacement of the board for inspection are restricted by the board positioning recess so as to position the board for inspection.

14. The relay connector as claimed in claim 13, wherein the floating guide is guided by a linear guide provided on the base member, and
the floating guide is adapted to be contacted with and separated from the board mounting face of the base member in a vertical direction.

15. The relay connector as claimed in claim 12, wherein the pressure operating member is arranged so as to swing in such a manner that a face of the pressure operating member opposed to the floating guide approaches and separates with respect to the base member, and
a compression spring is provided in a contracted state between the pressure operating member and the base member so as to resiliently urge the pressure operating member in a direction in which the face of the pressure operating member opposed to the floating guide approaches the base member.

16. The relay connector as claimed in claim 12, wherein the pressure operating member is arranged so as to swing in such a manner that a face of the pressure operating member opposed to the floating guide approaches and separates with respect to the base member,
a lever member is arranged so as to swing by means of a swing shaft which is parallel to a swing shaft of the pressure operating member,
one end of the lever member is engaged with the floating guide, and the other end of the lever member is pressed by operation of the pressure operating member, and
the floating guide swings in a direction of separating from the base member into the open state, in association with a swing motion of the face of the pressure operating member opposed to the floating guide in the direction of separating from the base member.

17. The relay connector as claimed in claim 12, wherein a depth of the guide hole formed in the floating guide is set to be equal to a height of the connector to be inspected.

18. The relay connector as claimed in claim 12, wherein the floating guide is provided with a concave part on a face opposed to the pin block,
the pin block is provided with a convex part to be engaged with the concave part, on a face opposed to the floating guide, and
the floating guide and the pin block are relatively positioned by engagement between the concave part and the convex part.

19. The relay connector as claimed in claim 12, wherein an outside part of the pressure operating member at a distal end opposed to the floating guide is chamfered to form a slant face.

* * * * *